United States Patent
Yang

(10) Patent No.: US 9,549,486 B2
(45) Date of Patent: Jan. 17, 2017

(54) RAISED BODIED VAPOR CHAMBER STRUCTURE

(71) Applicant: ASIA VITAL COMPONENTS CO., LTD., Sinjhuang District, New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 99 days.

(21) Appl. No.: 13/950,257

(22) Filed: Jul. 24, 2013

(65) Prior Publication Data
US 2015/0027668 A1 Jan. 29, 2015

(51) Int. Cl.
*F28D 15/00* (2006.01)
*H05K 7/20* (2006.01)
*F28D 15/04* (2006.01)

(52) U.S. Cl.
CPC ........... *H05K 7/20336* (2013.01); *F28D 15/04* (2013.01); *F28D 15/046* (2013.01); *H05K 7/20309* (2013.01); *H05K 7/20318* (2013.01)

(58) Field of Classification Search
CPC .... F28D 15/04; F28D 15/0233; F28D 15/046; F28D 15/02; H05K 7/20336; H05K 7/20318; H05K 7/20309
See application file for complete search history.

(56) References Cited

U.S. PATENT DOCUMENTS

| | | | |
|---|---|---|---|
| 6,082,443 A * | 7/2000 | Yamamoto et al. | 165/104.26 |
| 6,269,866 B1 * | 8/2001 | Yamamoto et al. | 165/104.26 |
| 2011/0240264 A1 * | 10/2011 | Wang et al. | 165/104.26 |
| 2012/0145358 A1 * | 6/2012 | Moon | 165/104.26 |
| 2012/0168435 A1 * | 7/2012 | Chen et al. | 220/6 |

FOREIGN PATENT DOCUMENTS

TW 201300717 A1 1/2013

* cited by examiner

*Primary Examiner* — Marc Norman
*Assistant Examiner* — Jon T Schermerhorn
(74) *Attorney, Agent, or Firm* — C. G. Mersereau; Nikolai & Mersereau, P.A.

(57) ABSTRACT

A raised bodied vapor chamber structure is disclosed and includes a main body and a working fluid. The main body has a condensation section and an evaporation section and a chamber. The condensation section and the evaporation section are respectively disposed on two sides of the chamber. The evaporation section has a first face and a second face. A raised section is formed on the first face. The working fluid is filled in the chamber. The raised section is formed by means of mechanical processing as a support structure for enhancing the structural strength of the vapor chamber structure. The vapor chamber structure is manufactured at a much lower cost.

7 Claims, 6 Drawing Sheets

RAISED BODIED VAPOR CHAMBER STRUCTURE

BACKGROUND OF THE INVENTION

1. Field of the Invention

The present invention relates generally to a raised bodied vapor chamber structure, which can greatly lower the manufacturing cost.

2. Description of the Related Art

There is a trend to develop thinner and thinner electronic apparatuses nowadays. The ultra-thin electronic apparatus includes miniaturized components. The heat generated by the miniaturized components of the electronic apparatus has become a major obstacle to having better performance of the electronic apparatus and system. Even if the semiconductors forming the electronic component have been more and more miniaturized, the electronic apparatus is still required to have high performance.

The miniaturization of the semiconductors will lead to increase of thermal flux. The challenge to cooling the product due to increase of thermal flux exceeds the challenge simply caused by increase of total heat. This is because the increase of thermal flux will lead to overheating at different times with respect to different sizes and may cause malfunction or even burnout of the electronic apparatus.

In order to solve the problem of narrow heat dissipation space of the conventional technique, a vapor chamber (VC) is generally positioned on the chip as a heat sink. In order to increase the capillarity limit, capillary structures such as copper posts with sintered coatings, sintered posts and foamed posts are disposed in the vapor chamber as support structures and backflow passages. However, such structures are only applicable to the micro-vapor chamber with thinner upper and lower walls (under 1.5 mm). The above capillary structures are applied to the micro-vapor chamber as support structures. In this case, the micro-vapor chamber is supported only in the positions of the copper posts, sintered posts or foamed posts. The rest parts of the micro-vapor chamber are likely to collapse or sink. Under such circumstance, the planarity and strength of the entire micro-vapor chamber can be hardly maintained. As a result, it is impossible to thin the vapor chamber.

The working fluid of the vapor chamber is heated and evaporated in the evaporation section from a liquid phase into a vapor phase. After the vapor working fluid reaches the condensation section of the vapor chamber, the vapor working fluid is condensed from the vapor phase into the liquid phase. The liquid working fluid then flows back to the evaporation section for next circulation. The condensation section of the vapor chamber is generally a polished face or a face with sintered capillary structures. After the vapor working fluid is condensed in the condensation section into small water drops, under gravity or capillary attraction of the capillary structures, the liquid working fluid will flow back to the evaporation section. However, the conventional condensation section is a polished face so that the water drops will drop under gravity only after the water drops accumulate to a certain volume. Accordingly, the backflow efficiency is insufficient. Moreover, the backflow speed of the liquid working fluid is so slow that there is no working fluid in the evaporation section. As a result, a dry burn may take place to greatly lower the heat transfer efficiency. In order to enhance the backflow efficiency of the working fluid, it is necessary to add capillary structures to the vapor chamber.

However, the capillary structures (such as sintered bodies or mesh bodies) will make it impossible to thin the vapor chamber.

A conventional thin heat exchange plate is formed with channels as capillary structures by means of etching or formed with support structures. However, the etching precision is poor and the processing time is quite long. As a result, the manufacturing cost for the thin heat exchange plate or vapor chamber can be hardly lowered.

SUMMARY OF THE INVENTION

It is therefore a primary object of the present invention to provide a raised bodied vapor chamber structure, which is manufactured at lower cost.

It is a further object of the present invention to provide a manufacturing method of the raised bodied vapor chamber structure, which can greatly lower the manufacturing cost of the vapor chamber.

To achieve the above and other objects, the raised bodied vapor chamber structure of the present invention includes a main body, a raised section and a working fluid.

The main body has a condensation section and an evaporation section and a chamber. The condensation section and the evaporation section are respectively disposed on two sides of the chamber. The raised section is selectively formed on the evaporation section or the condensation section and protrudes from the evaporation section or the condensation section. The working fluid is filled in the chamber.

The raised bodied vapor chamber structure of the present invention is manufactured at much lower cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
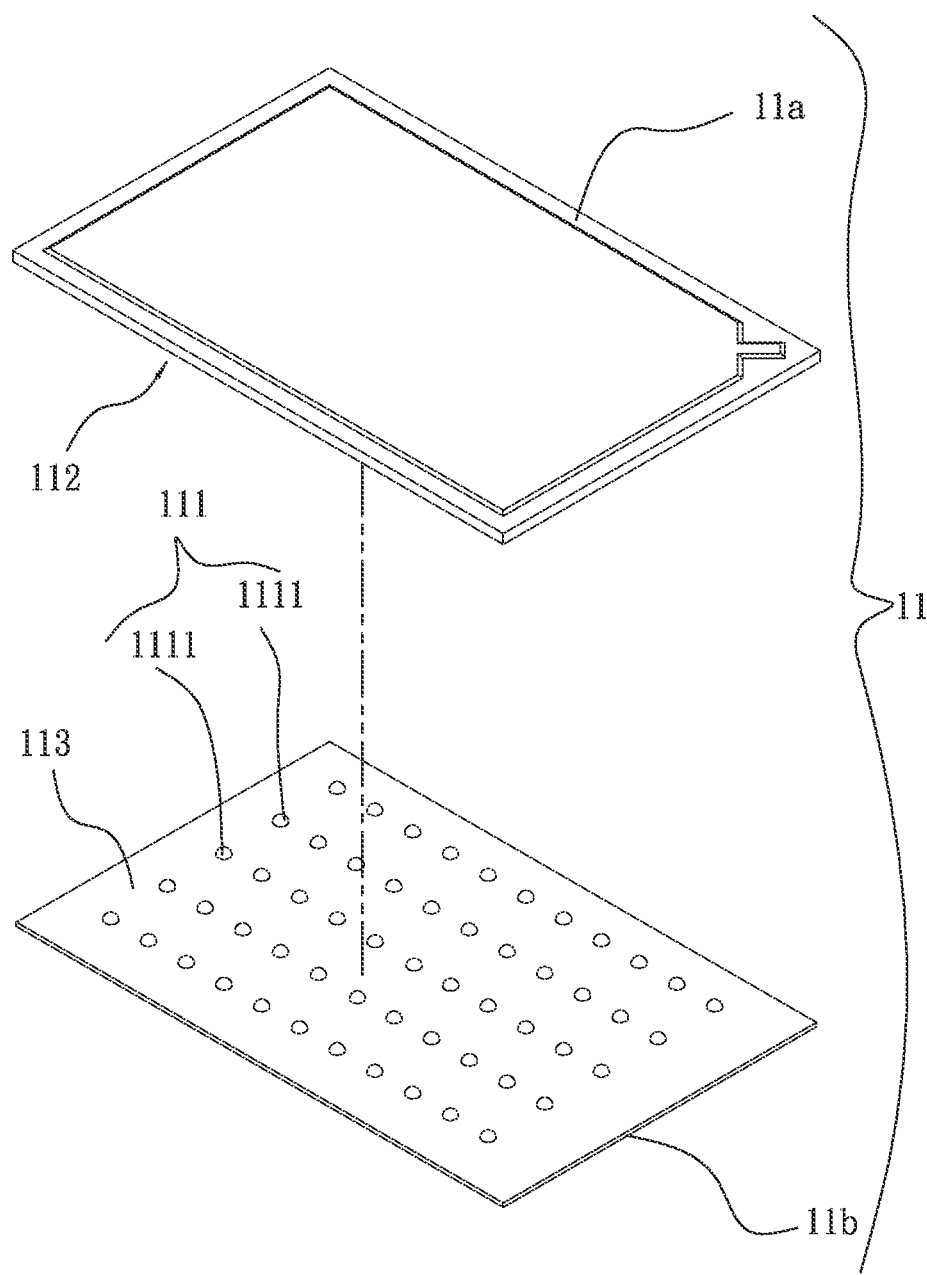
FIG. 1 is a perspective exploded view of a first embodiment of the raised bodied vapor chamber structure of the present invention.
Figure 2:
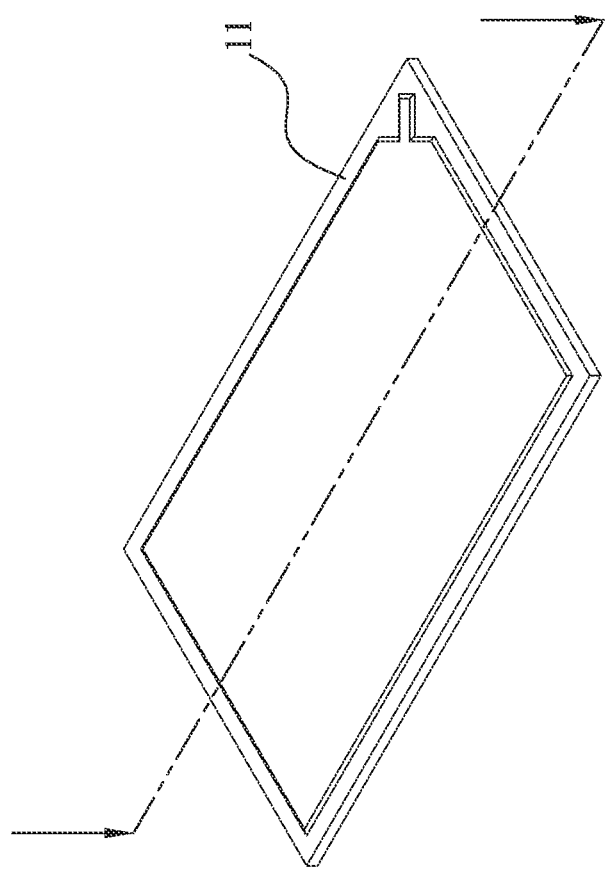
FIG. 2 is a perspective assembled view of the first embodiment of the raised bodied vapor chamber structure of the present invention.
Figure 3:
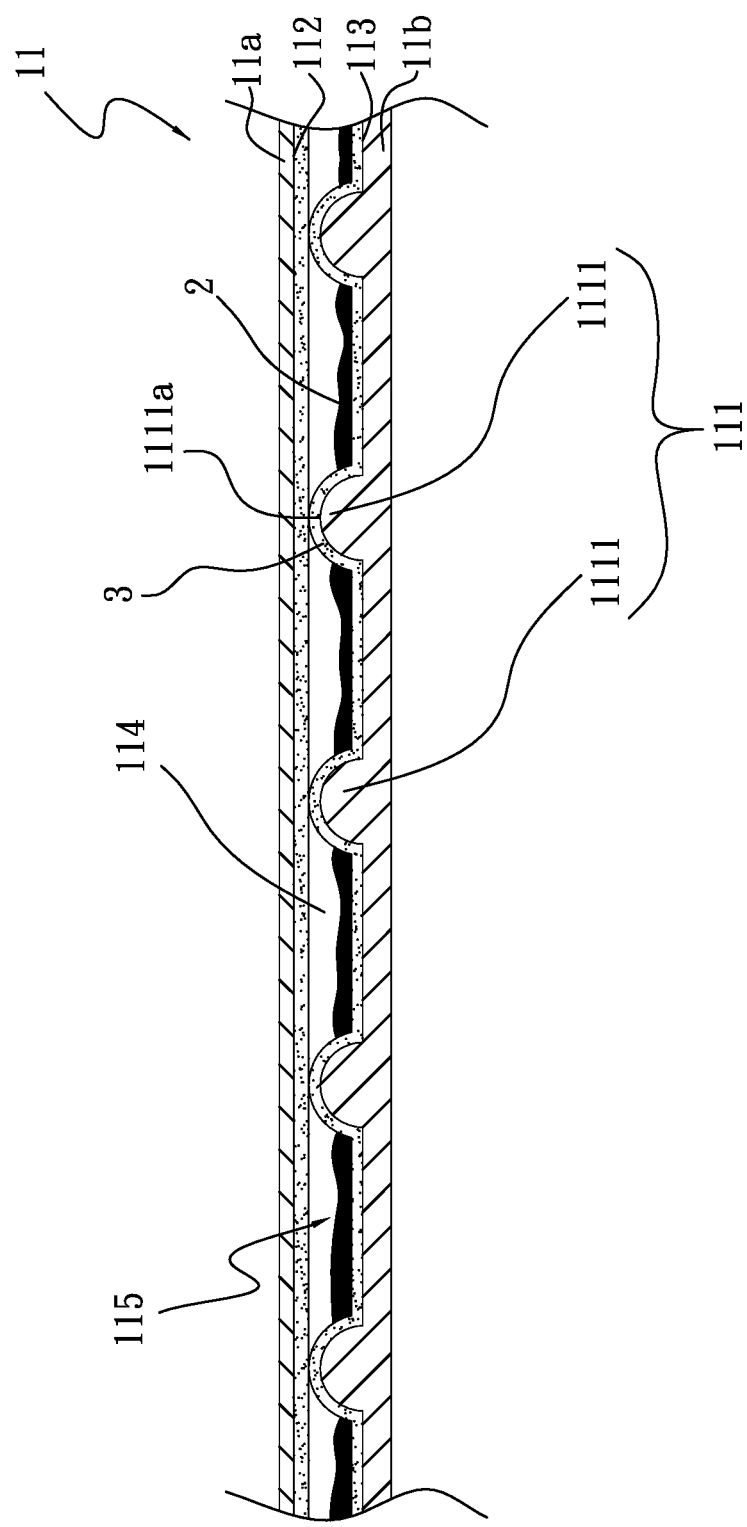
FIG. 3 is a sectional assembled view of the first embodiment of the raised bodied vapor chamber structure of the present invention.

Please refer to FIGS. 1, 2 and 3. FIG. 1 is a perspective exploded view of a first embodiment of the raised bodied vapor chamber structure of the present invention. FIG. 2 is a perspective assembled view of the first embodiment of the raised bodied vapor chamber structure of the present inven tion. FIG. 3 is a sectional assembled view of the first embodiment of the raised bodied vapor chamber structure of the present invention. According to the first embodiment, the raised bodied vapor chamber structure of the present invention includes a main body 11, a raised section 111, a capillary structure 2, and a working fluid 3.

The main body 11 has a condensation section 112 and an evaporation section 113 and a chamber 114. The main body 11 further has a first plate body 11a and a second plate body 11b. The first and second plate bodies 11a, 11b are mated with each other to together define the chamber 114. The condensation section 112 is disposed on one face of the first plate body 11a. The evaporation section 113 is disposed on one face of the second plate body 11b. To speak more specifically, the condensation section 112 and the evaporation section 113 are respectively disposed on two sides of the chamber 114 corresponding to each other.

The raised section 111 is formed on the evaporation section 113 or the condensation section 112 or both the evaporation section 113 and the condensation section 112. In this embodiment, the raised section 111 has multiple raised bodies 1111 protruding from the evaporation section 113 in a direction away from the evaporation section 113. Each raised body 1111 has a free end 1111a connected to the condensation section 112. The sections of the main body 11 around and in adjacency to the raised bodies 1111 are recesses 115. In this embodiment, the raised bodies 1111 are formed by means of embossing. The other faces of the raised bodies 1111 are planar. The working fluid 3 is filled in the chamber 114.

Figure 4:
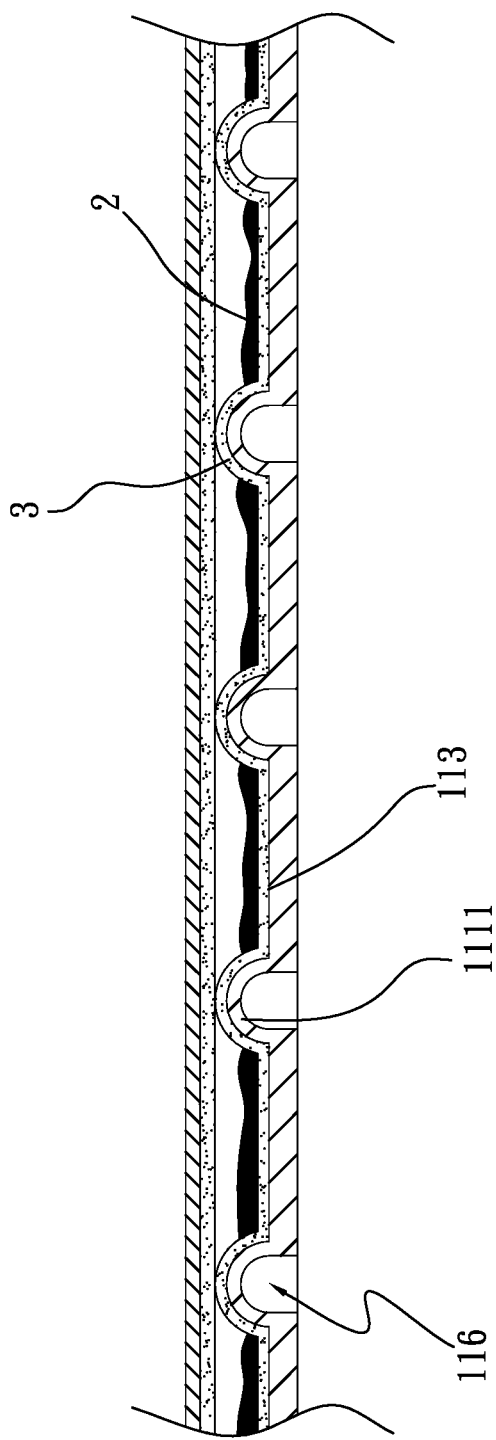
FIG. 4 is a sectional assembled view of a second embodiment of the raised bodied vapor chamber of the present invention.

Please now refer to FIG. 4, which is a sectional assembled view of a second embodiment of the vapor chamber of the present invention. The second embodiment is partially identical to the first embodiment in structure and thus will not be repeatedly described hereinafter. The second embodiment is different from the first embodiment in that the other faces of the raised bodies 1111 of the evaporation section 113 are recesses 116.

Figure 5:
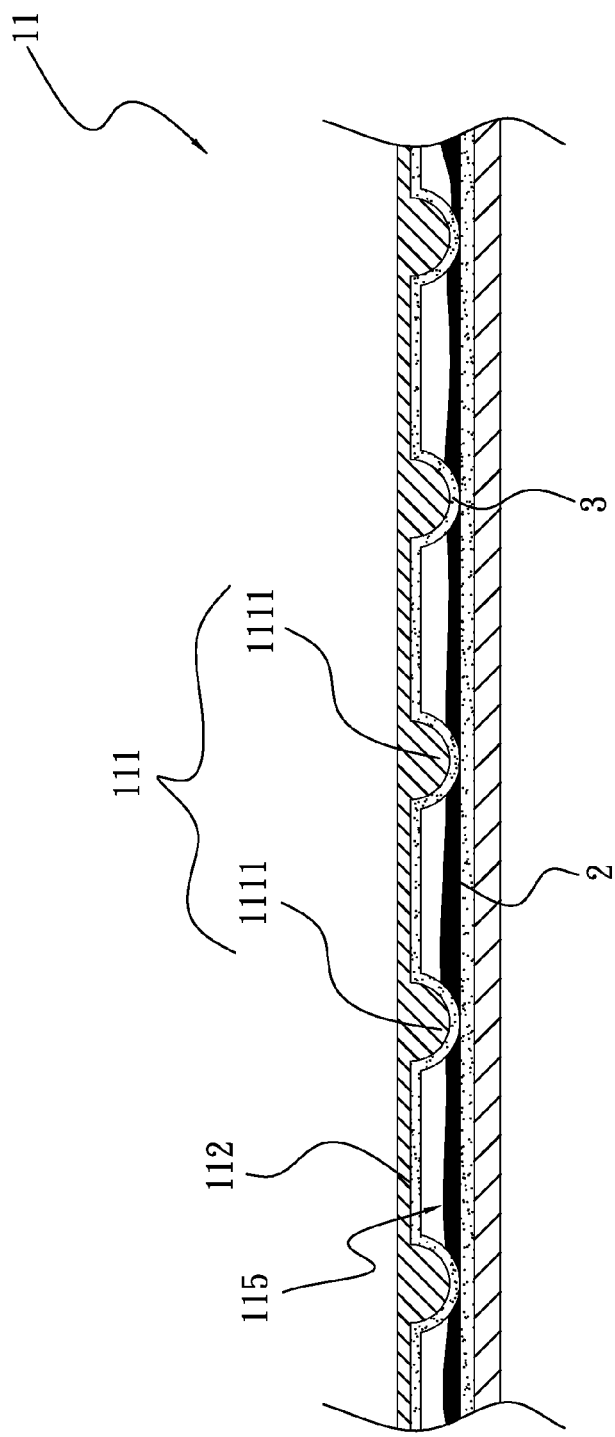
FIG. 5 is a sectional assembled view of a third embodiment of the raised bodied vapor chamber of the present invention.

Please now refer to FIG. 5, which is a sectional assembled view of a third embodiment of the vapor chamber of the present invention. The third embodiment is partially identical to the first embodiment in structure and thus will not be repeatedly described hereinafter. The third embodiment is different from the first embodiment in that the raised section 111 has multiple raised bodies 1111 protruding from the condensation section 112 in a direction away from the condensation section 112. The sections of the main body 11 around and in adjacency to the raised bodies 1111 are recesses 115.

Figure 6:
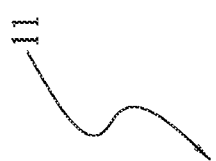
FIG. 6 is a sectional assembled view of a fourth embodiment of the raised bodied vapor chamber of the present invention.
Figure 6:
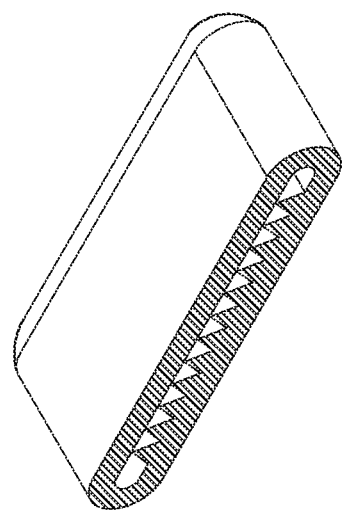

Please now refer to FIG. 6, which is a sectional assembled view of a fourth embodiment of the vapor chamber of the present invention. The fourth embodiment is partially identical to the first, second and third embodiments in structure and thus will not be repeatedly described hereinafter. The fourth embodiment is different from the first, second and third embodiment in that the main body 11 is a flat tubular body.

In the above embodiments, the vapor chamber structure further has a capillary structure 3 disposed on the surface of the chamber 114. That is, the capillary structure 3 is disposed between the raised bodies 1111 and the condensation section 112.

The present invention has been described with the above embodiments thereof and it is understood that many changes and modifications in the above embodiments can be carried out without departing from the scope and the spirit of the invention that is intended to be limited only by the appended claims.

What is claimed is:

1. A vapor chamber structure having a raised section comprising:
   a main body having a condensation section and an evaporation section and a chamber, the condensation section and the evaporation section being respectively disposed on two sides of the chamber;
   the raised section being located selectively on the evaporation section or the condensation section and protruding from the evaporation section or the condensation section;
   a working fluid filled in the chamber; and
   a capillary structure disposed on a surface of the chamber; wherein the main body has a first plate body and a second plate body, the first and second plate bodies being mated with each other to together define the chamber, the first plate body having a first planar outer face and a first inner face where the condensation section is disposed, the second plate body having a second planar outer face and a second inner face where the evaporation section is disposed; the raised section protruding from the first inner face of the first plate body or the second inner face of the second plate body; the capillary structure being disposed on the first and second inner faces of the first and second plate bodies in the chamber; the capillary structure on the first inner face of the first plate body extending onto the surface of the raised section protruding from the first inner face of the first plate body, the capillary structure on the raised section being in direct contact with the capillary structure on the second inner face of the second plate body or the capillary structure on the second inner face of the second plate body extending onto the surface of the raised structure protruding from the second inner face of the second plate body, the capillary structure on the raised section being in direct contact with the capillary structure on the first inner face of the first plate body.

2. The vapor chamber structure as claimed in claim 1, wherein the raised section has multiple raised bodies protruding from the evaporation section in a direction upward from the evaporation section, the sections of the main body around and in adjacency to the raised bodies being recesses.

3. The vapor chamber structure as claimed in claim 1, wherein the raised section has multiple raised bodies protruding from the condensation section in a direction downward from the condensation section, the sections of the main body around and in adjacency to the raised bodies being recesses.

4. The vapor chamber structure as claimed in claim 1, wherein the main body is a flat tubular body.

5. The vapor chamber structure as claimed in claim 2, wherein each raised body has a free end connected to the condensation section, a capillary structure being disposed between the raised bodies and the condensation section.

6. The vapor chamber structure as claimed in claim 1, wherein the raised section has multiple raised bodies protruding from the evaporation section in a direction upward from the evaporation section, the other face of the main body opposite to the raised bodies including recesses.

7. The vapor chamber structure as claimed in claim 1, wherein the raised section has multiple raised bodies protruding from the condensation section in a direction downward from the condensation section, the other face of the main body opposite to the raised bodies including recesses.

\* \* \* \* \*